US005896099A

United States Patent [19]

Yamauchi

[11] Patent Number: 5,896,099

[45] Date of Patent: Apr. 20, 1999

[54] AUDIO DECODER WITH BUFFER FULLNESS CONTROL

[75] Inventor: Hideki Yamauchi, Ogaki, Japan

[73] Assignee: Sanyo Electric Co., Ltd., Osaka, Japan

[21] Appl. No.: 08/682,866

[22] Filed: Jun. 28, 1996

[30] Foreign Application Priority Data

Jun. 30, 1995 [JP] Japan .................................... 7-166384
Jun. 6, 1996 [JP] Japan .................................... 8-144339

[51] Int. Cl.$^6$ .................................... H03M 7/00

[52] U.S. Cl. .................................... 341/50

[58] Field of Search .................................... 391/50

[56] References Cited

U.S. PATENT DOCUMENTS 5,323,272 6/1994 Klingler .................................... 360/8

FOREIGN PATENT DOCUMENTS

07307674 A 11/1995 Japan .
2 039 448 8/1980 United Kingdom .

OTHER PUBLICATIONS

Maturi *Single Chip MPEG Audio Decoder* IEEE Transaction on Consumer Electronics, vol. 38, No. 3 Aug. 1992, pp. 384–356.

*Primary Examiner*—Howard L. Williams
*Attorney, Agent, or Firm*—Sheridan Ross P.C.

[57] ABSTRACT

An audio decoding apparatus capable of preventing a buffer for storing an audio stream from overflowing is provided. The audio decoding apparatus decodes an audio stream including various kinds of coded data. The audio decoding apparatus includes a bit buffer for temporarily storing the audio stream, a decoder for receiving the audio stream from the bit buffer and decoding the audio stream to produce decoded audio data, and a data extractor, operatively coupled to the bit buffer, for extracting coded data necessary for the decoder from the audio stream and supplying the audio stream including the extracted necessary coded data to the bit buffer.

21 Claims, 12 Drawing Sheets

AUDIO DECODER WITH BUFFER FULLNESS CONTROL

BACKGROUND OF THE INVENTION

1. Field of the Invention

The present invention relates generally to a decoder which decodes encoded audio data. More particularly, the invention relates to an improvement on an audio decoder which controls encoded audio data stored in a buffer.

2. Description of the Related Art

Personal computers, as well as business and home entertainment systems, which handle a vast amount of and various types and forms of multimedia information, should process digitally recorded video and audio information at a fast speed. Such fast information processing can be achieved by data compression and expansion techniques, which directly affect the processing speed. The "MPEG" standards are one of such data compression and expansion techniques to improve the processing speed. The current MPEG standards are undergoing standardization by the MPEG Committee (ISO/IEC JTC1/SC29/WG11) under the ISO (International Organization for Standardization)/IEC (International Electrotechnical Commission).

The MPEG standards consist of three parts. Part 1 (ISO/IEC IS 11172-1: MPEG system part) defines the multiplex structure of video data and audio data and the synchronization system. Part 2 (ISO/IEC IS 11172-2: MPEG video part) defines the high efficiency coding system for video data and the format for video data. The part 3 (ISO/IEC IS 11172-3: MPEG audio part) defines the high efficiency coding system for audio data and the format for audio data.

Video data that is handled with respect to an MPEG video part includes moving pictures each consisting of several tens of (e.g., 30) frames per second. The video data has a six-layer structure of a sequence including a plurality of Groups Of Pictures (GOP's), GOP's each including a plurality of pictures, a plurality of slices in each picture, a plurality of macroblocks in each slice and a plurality of blocks in each macroblock.

At present, there are two MPEG standards, MPEG-1 and MPEG-2, that mainly differ in the encode rate at which video and audio data are encoded. In MPEG-1, frames correspond to pictures. In MPEG-2, either a frame or a field corresponds to a picture. Two fields constitute one frame. The structure where a frame corresponds to a picture is called a frame structure, while the structure where a field corresponds to a picture is called a field structure.

In MPEG, a compression technique called intra-frame prediction is employed. Intra-frame prediction compresses intra-frame data based on a chronological correlation among frames. Intra-frame prediction includes bidirectional prediction. Bidirectional prediction uses both forward prediction for predicting a current reproduced image (or picture) from an old reproduced image (or picture) and backward prediction for predicting a current reproduced image from a future reproduced image.

Bidirectional prediction uses I (Intra-coded) picture, P (Predictive-coded) picture and B (Bidirectionally-coded) picture. An I-picture is produced independently irrespective of old and future reproduced images. A P-picture is produced by forward prediction (prediction from an old decoded I- or P-picture). A B-picture is produced by bidirectional prediction. In bidirectional prediction, a B-picture is produced by one of the following three predictions.

(1) Forward Prediction: prediction from an old decoded I- or P-picture.

(2) Backward Prediction: prediction from a future decoded I- or P-picture.

(3) Bidirectional Prediction: prediction from old and future decoded I- or P-pictures.

An I-picture is produced without an old picture or a future picture, whereas every P-picture is produced by referring to an old picture and every B-picture is produced by referring to an old or future picture.

In intra-frame prediction, an I-picture is periodically produced first. Then, a frame several frames ahead of the I-picture is produced as a P-picture. This P-picture is produced by the prediction in one direction from the past to the present (forward direction). Next, a frame located before the I-picture and after the P-picture is produced as a B-picture. At the time this B-picture is produced, the optimal prediction scheme is selected from among forward prediction, backward prediction and bidirectional prediction. In general, a current image and its preceding and succeeding images in consecutive motion pictures are similar to one another and that they differ only partially. In this respect, it is assumed that the previous frame (e.g., I-picture) and the next frame (e.g., P-picture) are substantially the same. If there is a slight difference (B-picture data) between both frames, this difference is extracted and compressed. Accordingly, the intra-frame data can be compressed based on the chronological correlation among consecutive frames.

A series of video data encoded according to the MPEG video standards in the above manner is called an MPEG video bit stream. A series of audio data encoded according to the MPEG audio standards is called an MPEG audio bit stream. The video and audio stream are time-divisionally multiplexed according to the MPEG system part to generate an MPEG system bit stream.

MPEG-1 is mainly associated with storage media such as a CD (Compact Disc), a CD-ROM (Compact Disc-Read Only Memory) and a DVD (digital video disk), while MPEG-2 includes the MPEG-1 and is used in a wide range of applications.

MPEG audio has three modes, namely, layer I, layer II and layer III; a higher layer can achieve a higher sound quality and higher compression ratio. An audio stream has a plurality of frames each called AAU (Audio Access Unit). Each AAU is the minimum independently decodable unit and includes a given number of pieces of sample data for each layer. The layer I has 384 pieces of sample data, and the layers II and III have 1152 pieces of sample data.

The AAU format has a header at the top, followed by an optional error check code (CRC: Cyclic Redundancy Code—16 bits) and audio data. The fields from the header to the audio data are used to reproduce an audio signal. The header defines the sampling frequency, which is a field to specify the sampling rate and is selected from among three frequencies (32 KHz, 44.1 KHz and 48 KHz). Audio data is a variable length data. When the end of audio data does not coincide with the end of the AAU, the remaining portion of the AAU (or the gap portion from the end of the audio data to the end of the AAU) is called "ancillary data". It is possible to insert any data other than MPEG audio into this ancillary data. In the MPEG-2, multichannel data and multilingual data are inserted in the ancillary data.

Audio data belonging to the layer I includes an allocation field, scale factor field and sample field. Individual audio data belonging to the layers II and III include an allocation field, scale factor select information, scale factor field and sample field.

The scale factor indicates the magnification when a waveform is reproduced for each subband and each channel. The scale factor is expressed by six bits in association with each subband and each channel, and can indicate the magnification in units of approximately 2 dB over a range of +6 dB to −118 dB. The value of a scale factor corresponds to the sound pressure level of a sound to be reproduced. Therefore, a scale factor value equal to or smaller than a certain value indicates that the reproduced sound has a sound pressure level inaudible by people (i.e., no sound).

In the MPEG audio, the human audio characteristic (audio psychological model) including the masking effect and minimum audible limit characteristic is used. The masking effect is such that when a large sound is produced at a certain frequency, a sound, the frequency of which is close to that certain frequency and the level of which is equal to or below a certain level, becomes inaudible or is difficult to hear. The minimum audible limit characteristic defines a given frequency characteristic such that human ears are most sensitive to a band of human voices of several hundreds of Hz and cannot hear sounds whose levels are equal to or lower than a certain sound pressure level in an ultra low frequency range or an ultra high frequency range.

To compress audio data, first an MPEG audio encoder divides a received audio signal to 32 subbands using a band split filter. The encoder then utilizes the masking effect and minimum audible limit characteristic to quantize individual split audio signals in such a manner that no bits are assigned to sounds that have become inaudible by the masking. This quantization reduces the amount of information for data compression. More specifically, the masking effect and minimum audible limit characteristic are combined to set the mask level that indicates a dynamic change together with an audio signal and a signal equal to or below the mask level is subjected to data compression. As a result, the layer I indicates the compression effect with an encode rate of 192 K, 128 Kbps and a compression ratio of ¼ and can have a sound quality equivalent to that of CD-DA (CD Digital Audio) and PCM (Pulse Code Modulation). The layer II indicates the compression effect with an encode rate of 128 K, 96 Kbps and a compression ratio of ⅙ to ⅛ and can have a sound quality equivalent to that of MD and DCC. The layer III indicates the compression effect with an encode rate of 128 K, 96K, 94 Kbps and a compression ratio of ⅙ to 1/12.

FIG. 1 is a block diagram indicating a conventional MPEG audio decoder 301. The MPEG audio decoder 301 has a bit buffer 302 and a decode core circuit 303. The bit buffer 302 is a ring buffer which has a RAM (Random Access Memory) with the FIFO (First-In-First-Out) structure, and sequentially stores audio streams transferred from an external device (recording medium like a video CD or DVD, an information processing device like a personal computer or the like). The decode core circuit 303 decodes a plurality of AAUs (frames) included in an audio stream in conformity to the MPEG audio part to thereby produce a compressed audio stream.

The decode core circuit 303 includes a dequantizer 304, a band synthesizer 305, a PCM output circuit 306 and a control circuit 307. The control circuit 307 detects the header affixed to the top of each AAU included in the audio stream stored in the bit buffer 302. Based on the detected header, the control circuit 307 controls the bit buffer 302 in such a way that an audio stream is read out for each AAU. The control circuit 307 detects the previously defined sampling frequency from the header, and produces a pipeline signal having pulses corresponding to the detected sampling frequency. The operations of the dequantizer 304, the band synthesizer 305 and the PCM output circuit 306 are controlled in accordance with this pipeline signal. The individual units 304 to 306 have operation speeds corresponding to the pipeline signal.

The dequantizer 304 performs dequantization, the opposite process to that of the encoder, on each AAU read from the bit buffer 302 to produce a dequantized AAU. The band synthesizer 305 receives the dequantized AAU from the dequantizer 304 and performs a product-sum operation called "butterfly operation" to combine individual pieces of audio data, which has been split to 32 subbands. As a result, decoded audio data is acquired. The PCM output circuit 306, which comprises an output interface and cross attenuator, receives decoded audio data from the band synthesizer 305 and produces an audio signal (PCM output signal). A D/A converter (not shown) performs D/A conversion of the audio signal. An audio amplifier (not shown) amplifies the analog audio signal so that sounds are reproduced from a loudspeaker.

The bit buffer 302 may overflow if the bit rate of the audio stream transferred from an external device is greater than the specified value. When an overflow occurs, the bit buffer 302 comprised of a ring buffer overwrites the previously stored audio stream with a newly input audio stream. This destroys the audio stream which has been previously stored in the bit buffer 302 resulting in data loss. Consequently, no sounds can be reproduced from the lost audio stream, causing sound skipping in the reproduced sound. This sound skipping is uncomfortable to the user's ears.

In the following cases, the bit rate of an audio stream becomes greater than the specified value.

Case 1: When sounds are reproduced faster than the normal (standard) playback speed. Fast playback is used when the user wants to perform fast forward playback to listen to sounds in a short period of time using a recording medium as an external device or when the user wants to perform fast forward playback or fast rewind playback to search for the desired sounds.

Case 2: When an information processing device is used as an external device. An information processing device like a microcomputer should not necessarily encode an audio stream in conformity to the standards. Therefore, the bit rate of an audio stream may come off the specified range. For recording media like a video CD and DVD, the bit rate of an audio stream is set in conformity to the MPEG audio part.

Japanese Unexamined Patent Publication No. 7-307674 discloses a decoder which raises the transfer rate (bit rate) of input data and increases the data processing speed to decode data instantaneously on second column, lines 40 to 46. This publication further teaches on the eighth column, line 29 to the ninth column, line 11 that data to be supplied to the decoder can be thinned out by controlling data writing into the FIFO memory.

SUMMARY OF THE INVENTION

Accordingly, it is a primary object of the present invention to provide an MPEG audio decoder capable of preventing a buffer for storing an audio stream from overflowing.

To achieve the foregoing and other objects and in accordance with the purpose of the present invention, an improved audio decoder is provided. According to an embodiment of the invention, the audio decoding apparatus for decoding an audio stream including various kinds of coded data, includes a bit buffer for temporarily storing the audio stream, a decoder for receiving the audio stream from the bit buffer and decoding the audio stream to produce decoded audio data, and a data extractor, operatively coupled to the bit buffer, for extracting coded data necessary for the decoder from the audio stream and supplying the audio stream including the extracted necessary coded data to the bit buffer.

According to an another embodiment of the invention, the audio decoding apparatus for decoding an audio stream, includes a bit buffer for temporarily storing the audio stream, a decoder for receiving the audio stream from the bit buffer and decoding the audio stream to produce decoded audio data, and an audio stream control circuit, operatively coupled to the bit buffer, for checking an occupied amount of the audio stream occupying the bit buffer and preventing the audio stream from being supplied to the bit buffer while the occupied amount of the audio stream exceeds a given amount.

According to a yet another embodiment of the invention, the audio decoding apparatus for decoding an audio stream, includes a bit buffer for temporarily storing the audio stream, a decoder for receiving the audio stream from the bit buffer and decoding the audio stream to produce decoded audio data, and a speed control circuit, operatively coupled to the bit buffer and the decoder, for checking an occupied amount of the audio stream occupying the bit buffer and controlling the decoder in such a way that an operational speed becomes faster as the occupied amount of the audio stream increases.

According to an another embodiment of the invention, the audio decoding apparatus for decoding an audio stream includes a bit buffer for temporarily storing the audio stream, a decoder for receiving the audio stream from the bit buffer and decoding the audio stream to produce decoded audio data. The decoder checks a value of a scale factor in coded audio data included in each frame and operates to skip a part of the audio stream to prevent the audio stream from being decoded when the value of the scale factor is equal to or smaller than a predetermined value.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 1:
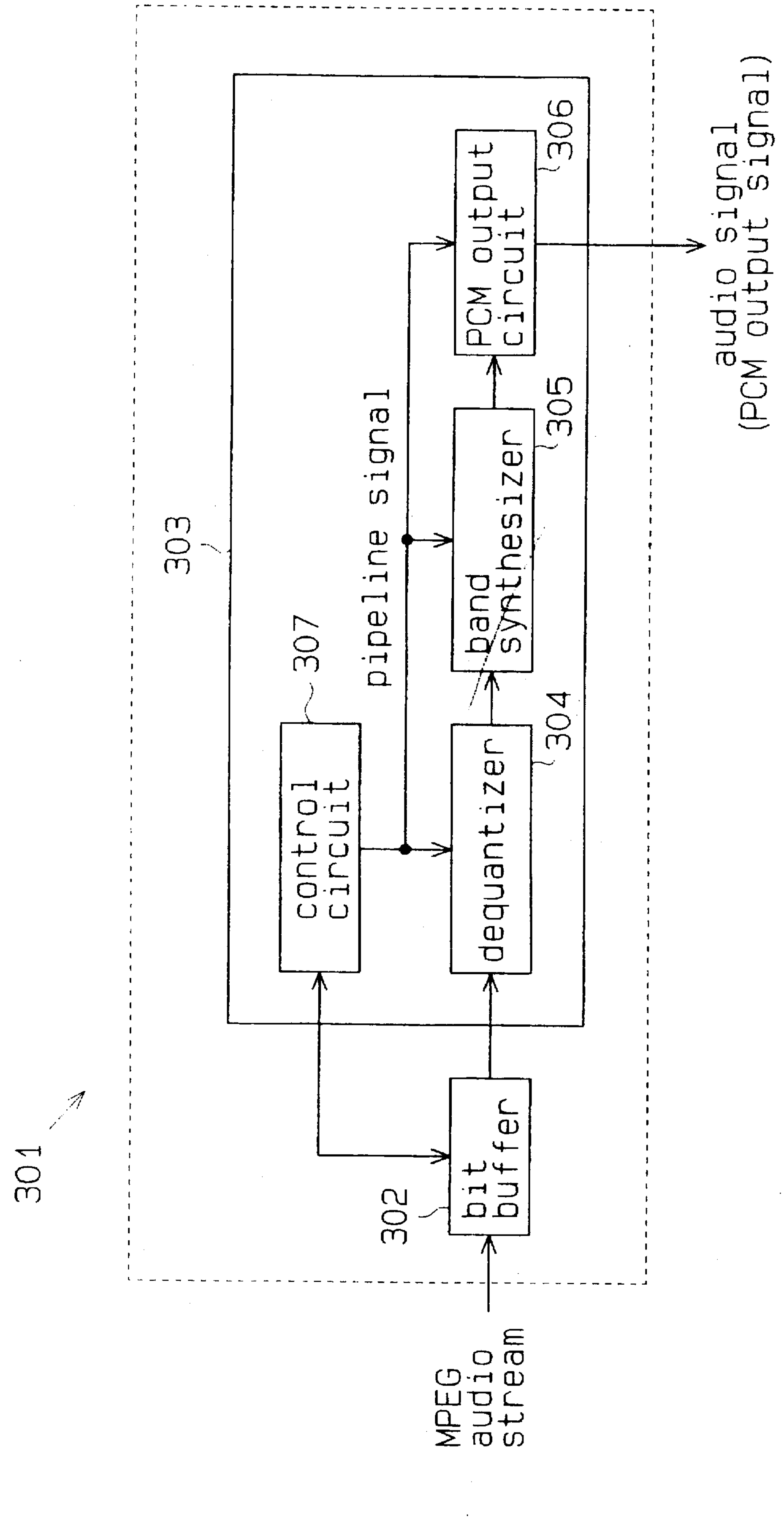
Fig.1 (Prior Art)
FIG. 1 is a block diagram showing a conventional audio decoder.
Figure 2:
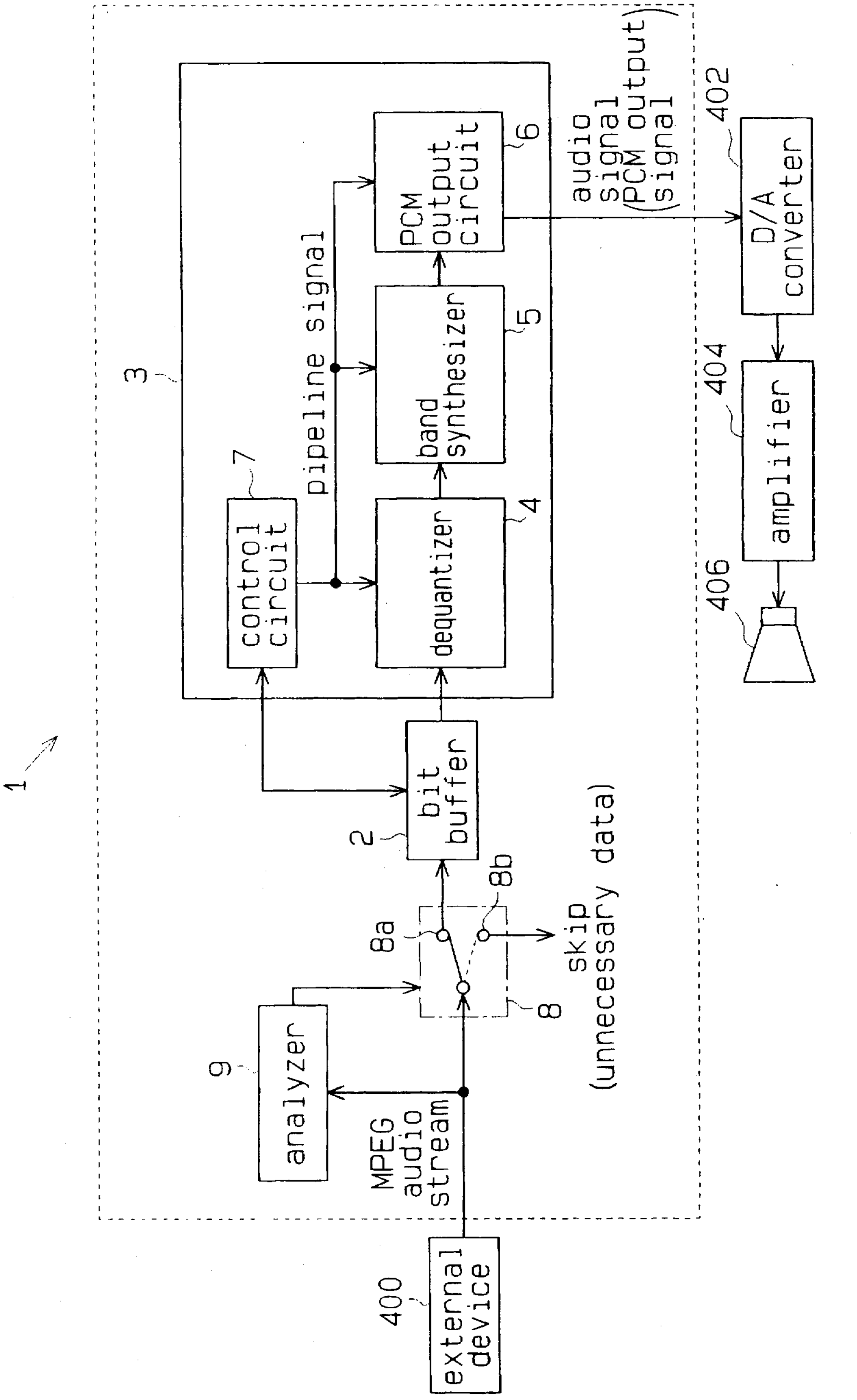
FIG. 2 is a block diagram showing an audio decoder according to the first embodiment of the invention.

The first embodiment of this invention will be now described with reference to the accompanying drawings. As shown in FIG. 2, in this embodiment, the invention is adapted to an audio decoder which conforms to the MPEG (Moving Picture Experts Group) standards. As shown in FIG. 2, an MPEG audio decoder 1 according to the first embodiment comprises a bit buffer 2, a decode core circuit 3, a skip circuit 8 and an analyzer 9. The bit buffer 2, decode core circuit 3, skip circuit 8 and analyzer 9 are mounted on a single large scale integrated circuit (LSI) chip. The skip circuit 8 and analyzer 9 form a data extractor.

An audio stream which has been transferred at a given rate from an external device 400 (a reproducing apparatus using a recording medium like a video CD or DVD, or an information processing device like a personal computer) is sent via the skip circuit 8 to the bit buffer 2. The skip circuit 8 has a first node 8*a* and a second node 8*b*, which are selectively switched from one to the other under the control of the analyzer 9. When the skip circuit 8 is set to the first node 8*a*, an audio stream from the external device 400 is transferred to the bit buffer 2. When the skip circuit 8 is set to the second node 8*b*, an audio stream is not transferred to the bit buffer 2, but is skipped. As a result, the audio stream which should be transferred to the bit buffer 2 is thinned by the skip circuit 8.

The bit buffer 2 is a ring buffer which has a RAM (Random Access Memory) with the FIFO structure, and sequentially stores audio streams. The analyzer 9 analyzes various kinds of data included in each of a plurality of AAUs (Audio Access Units) included in an audio stream. The analyzer 9 further separates necessary data for the decode core circuit 3 and unnecessary data based on the analyzing result and controls the skip circuit 8 according to this data separation.

The AAU format has a header at the top, followed by an optional error check code (CRC: Cyclic Redundancy Code—16 bits) and audio data. The fields from the header to the audio data are used to reproduce an audio signal. The header defines the sampling frequency, which is a field to specify the sampling rate and is selected from among three frequencies (32 KHz, 44.1 KHz and 48 KHz). Audio data is variable length data. When the end of audio data does not coincide with the end of the AAU, the remaining portion of the AAU (or the gap portion from the end of the audio data to the end of the AAU) is called "ancillary data". Any data other than MPEG audio can be inserted into this ancillary data. In the MPEG-2, for example, multichannel data and multilingual data are inserted in the ancillary data.

The analyzer 9 controls the skip circuit 8 in such a manner that an audio stream including necessary data for the decode core circuit 3 (i.e., the header, error check code and audio data) in each AAU is transferred to the bit buffer 2. When the necessary data is present in each AAU in an audio stream, the analyzer 9 controls the skip circuit 8 in such a manner that the first node 8a is set to transfer the necessary data in each AAU in the audio stream is transferred to the bit buffer 2. When unnecessary data for the decode core circuit 3 (e.g., ancillary data or error data) is present in each AAU, the analyzer 9 controls the skip circuit 8 in such a manner that the second node 8b is set to skip the unnecessary data in each AAU included in the audio stream.

As apparent from the above, the analyzer 9 and the skip circuit 8 extract only the necessary data for the decode core circuit 3 from each AAU and transfer the data to the bit buffer 2. Consequently, the bit buffer 2 can store just the necessary data. This storage scheme can reduce the amount of data to be stored in the bit buffer 2 (the occupied amount in the bit buffer 2) as compared to that in the conventional MPEG audio decoder. Even when the bit rate of an audio stream exceeds the specified value, an overflow of the bit buffer 2 can be prevented. In other words, because of the decreased occupied amount of an audio stream in the bit buffer 2, the capacitance of the bit buffer 2 can be reduced if there is no possibility of overflowing of the bit buffer 2.

The decode core circuit 3 includes a dequantizer 4, a band synthesizer 5, a PCM output circuit 6 and a control circuit 7. The decode core circuit 3 receives an MPEG audio stream including AAUs (frames), and decodes the audio stream in conformity to the MPEG audio part to produce an audio signal (PCM output signal).

The control circuit 7 reads each AAU included in an audio stream from the bit buffer 2 and detects the header affixed to the top of each AAU. At this time, only necessary data for the decode core circuit 3 is stored in the bit buffer 2. It is therefore possible to reduce the number of times the control circuit 7 accesses to the bit buffer 2 for reading AAUs. In accordance with the result of the header detection, the control circuit 7 controls the bit buffer 2 in such a way that an audio stream is read out for each AAU. Further, the control circuit 7 detects the previously defined sampling frequency from the header in each AAU, and produces a pipeline signal having pulses corresponding to the detected sampling frequency. The pipeline signal is supplied to the dequantizer 4, the band synthesizer 5 and the PCM output circuit 6, which operate in accordance with this pipeline signal. The operation speeds of the individual units 4, 5 and 6 are therefore determined by the pipeline signal.

The dequantizer 4 performs dequantization, the opposite process to that of the encoder, on each AAU read from the bit buffer 2 to produce a dequantized AAU. The band synthesizer 5 receives the dequantized AAU from the dequantizer 4 and performs a product-sum operation called "butterfly operation" to combine individual pieces of audio data which has been split to 32 subbands. As a result, decoded audio data is acquired. The PCM output circuit 6, which comprises an output interface and cross attenuator, receives decoded audio data from the band synthesizer 5 and produces an audio signal (PCM output signal). The audio signal is supplied to a D/A converter 402 to be converted to an analog audio signal from the digital audio signal. An audio amplifier 404 amplifies the analog audio signal so that sounds are reproduced from a loudspeaker 406.

Second Embodiment

Figure 3:
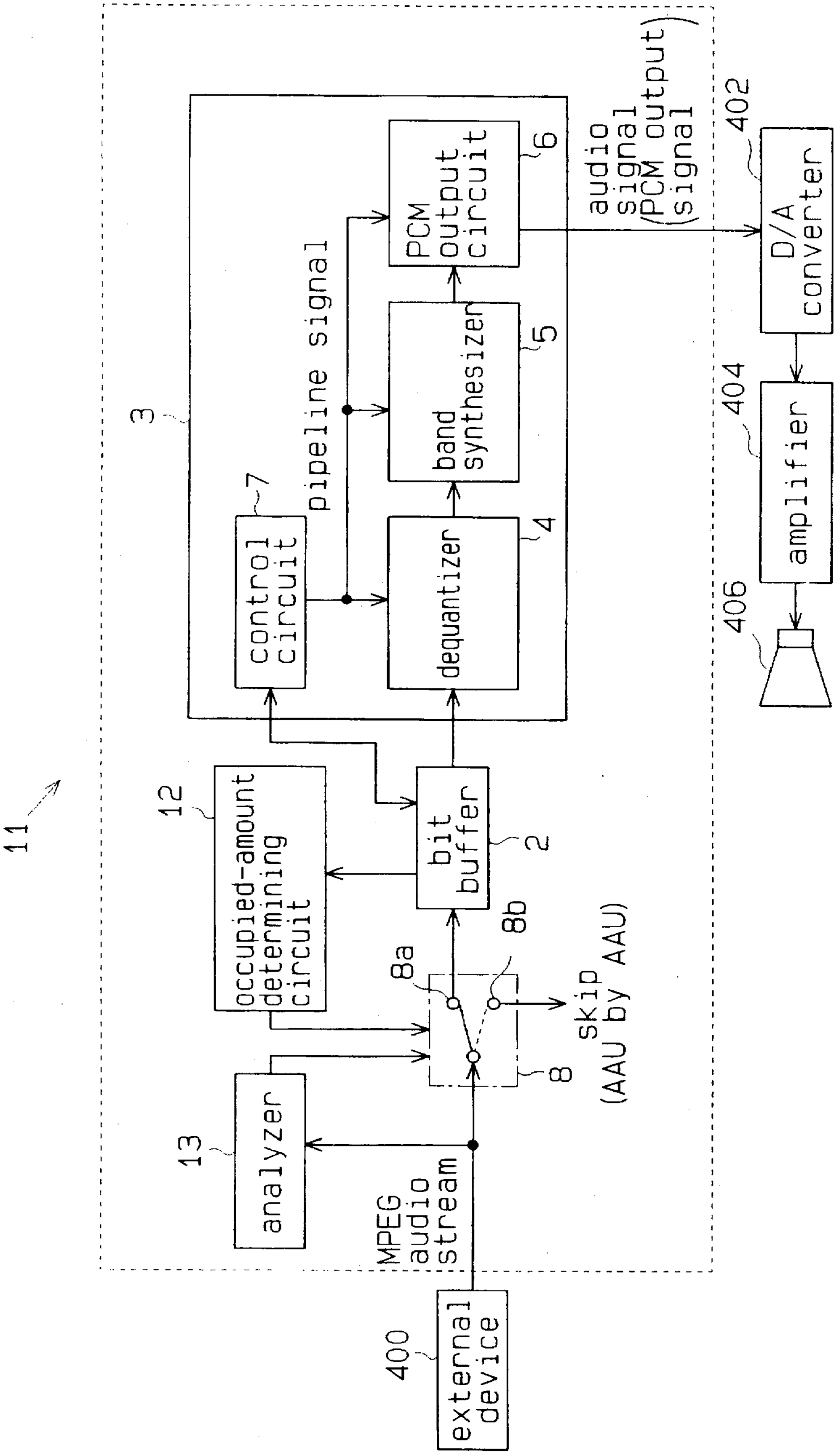
FIG. 3 is a block diagram showing an audio decoder according to the second embodiment of the invention.
Figure 4:
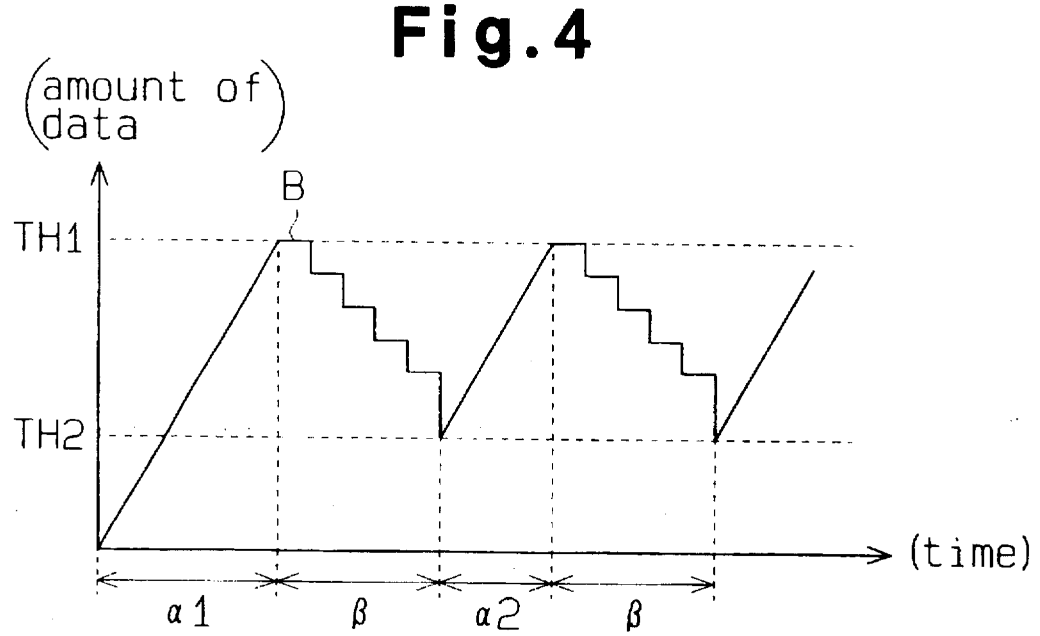
FIG. 4 is a graph showing the relationship between the occupied amount of an audio stream in a bit buffer in the audio decoder according to the second embodiment and time.
Figure 5:
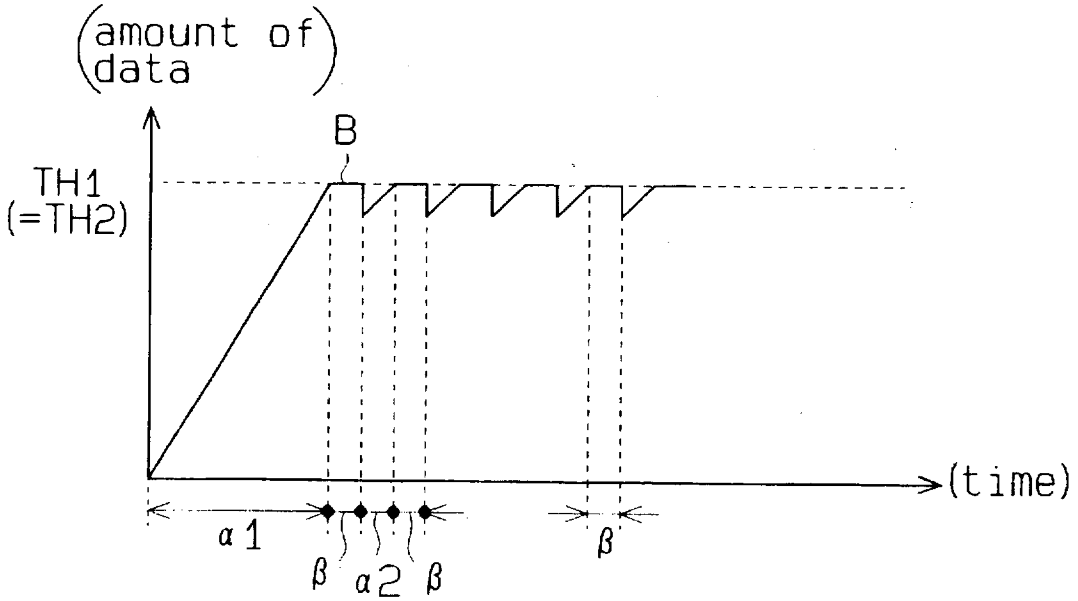
FIG. 5 is a graph showing the relationship between the occupied amount of an audio stream in a bit buffer in an audio decoder according to a modification of the second embodiment and time.

The second embodiment of this invention will be now be discussed referring to FIGS. 3 through 5. To avoid the redundant description, like or same reference numerals are given to those components which are the same as the corresponding components of the first embodiment. As shown in FIG. 3, an MPEG audio decoder 11 according to the second embodiment comprises a bit buffer 2, a decode core circuit 3, a skip circuit 8, an occupied-amount determining circuit 12, and an analyzer 13. The bit buffer 2, decode core circuit 3, skip circuit 8, occupied-amount determining circuit 12 and analyzer 13 are mounted on a single LSI chip. The skip circuit 8, the occupied-amount determining circuit 12 and the analyzer 13 form an audio stream control circuit.

The skip circuit 8 has first and second nodes 8a and 8b, which are selectively switched from one to the other under the control of the occupied-amount determining circuit 12 and the analyzer 13. The occupied-amount determining circuit 12 detects the occupied amount B of an audio stream in the bit buffer 2 and determines if the bit buffer 2 may overflow, based on the detected occupied amount B and predetermined first and second threshold values TH1 and TH2. The first threshold value TH1 indicates the upper limit of an audio stream that can be stored safely in the bit buffer 2 without overflowing. The second threshold value TH2 indicates the lower limit of an audio stream, the storage of which in the bit buffer 2 can start safely without overflowing.

The analyzer 13 analyzes each AAU included in the audio stream transferred from the external device 400 and controls the skip circuit 8 so that AAUs are transferred to the bit buffer 2 without being cut off. As a result, the audio stream to be transferred to the bit buffer 2 is thinned AAU by AAU by the skip circuit 8.

The operation of the second embodiment will be discussed below with reference to FIG. 4. When the detected occupied amount B is smaller than the preset first threshold value TH1, the occupied-amount determining circuit 12 determines that the bit buffer 2 may not overflow. In this case, the occupied-amount determining circuit 12 and the analyzer 13 control the skip circuit 8 in such a manner that the first node 8a is set at the timing at which the currently transferred AAU is not cut off, so that the audio stream is directly transferred to the bit buffer 2. Through this control, the occupied amount B of the bit buffer 2 increases in proportional to the bit rate of the audio stream during the period indicated by $\alpha 1$ in FIG. 4.

When the detected occupied amount B becomes greater than the preset first threshold value TH1, the occupied-amount determining circuit 12 determines that the bit buffer 2 may overflow. In this case, the occupied-amount determining circuit 12 and the analyzer 13 control the skip circuit 8 in such a manner that the second node 8b is set at the timing at which the currently transferred AAU is not cut off, so that the audio stream is skipped AAU by AAU. Through this control, the occupied amount B of the bit buffer 2 decreases during the period indicated by $\beta$ in FIG. 4 as the AAUs are read from the bit buffer 2. As apparent from the above, the control on the skip circuit 8 by the occupied-amount determining circuit 12 and the analyzer 13 permits the occupied amount B of the bit buffer 2 to always be kept at the optimal value. Although the bit rate of the audio stream is greater than the specified value, therefore, it is possible to positively prevent the bit buffer 2 from overflowing.

When the detected occupied amount B becomes smaller than the preset second threshold value TH2, the occupied-amount determining circuit 12 determines that the bit buffer 2 will no longer overflow. In this case, the occupied-amount determining circuit 12 and the analyzer 13 control the skip circuit 8 in such a manner that the first node 8a is set at the timing at which the currently transferred AAU is not cut off, so that the audio stream is directly transferred to the bit buffer 2. Through this control, the occupied amount B of the bit buffer 2 increases in proportional to the bit rate of the audio stream during the period indicated by $\alpha 1$ in FIG. 4.

In the period $\beta$, AAUs are not supplied to the bit buffer 2 and are skipped. The decode core circuit 3 continuously produces audio signals from the AAUs supplied in the periods $\alpha 1$ and $\alpha 2$, not from the AAUs skipped in this period $\beta$. That is, the time for the continuous production of audio signals (the time during which sounds are continuously reproduced) corresponds to the periods $\alpha 1$ and $\alpha 2$. When this continuous sound reproduction time becomes too short, the reproduced sounds suffer sound cutting, making the sound unpleasant. It is therefore preferable that the first and second threshold values TH1 and TH2 be set to the optimal values through actual hearing experiences.

Further, an audio stream is skipped AAU by AAU by the skip circuit 8, while an audio stream is stored also AAU by AAU in the bit buffer 2. This feature allows the decode core circuit 3 to produce an audio signal AAU by AAU.

Through the simulation in fast reproduction according to the second embodiment, it was confirmed that the overflow of the bit buffer 2 was prevented even in faster reproduction than the 8X reproduction and the reproduced sounds did not suffer sound cutting.

According to the second embodiment, the first and second threshold values TH1 and TH2 may be set to the same value, as shown in FIG. 5. In this case, the comparison and determination of the occupied-amount determining circuit 12 become simpler, allowing the circuit scale of the occupied-amount determining circuit 12 to be made smaller.

Third Embodiment

Figure 6:
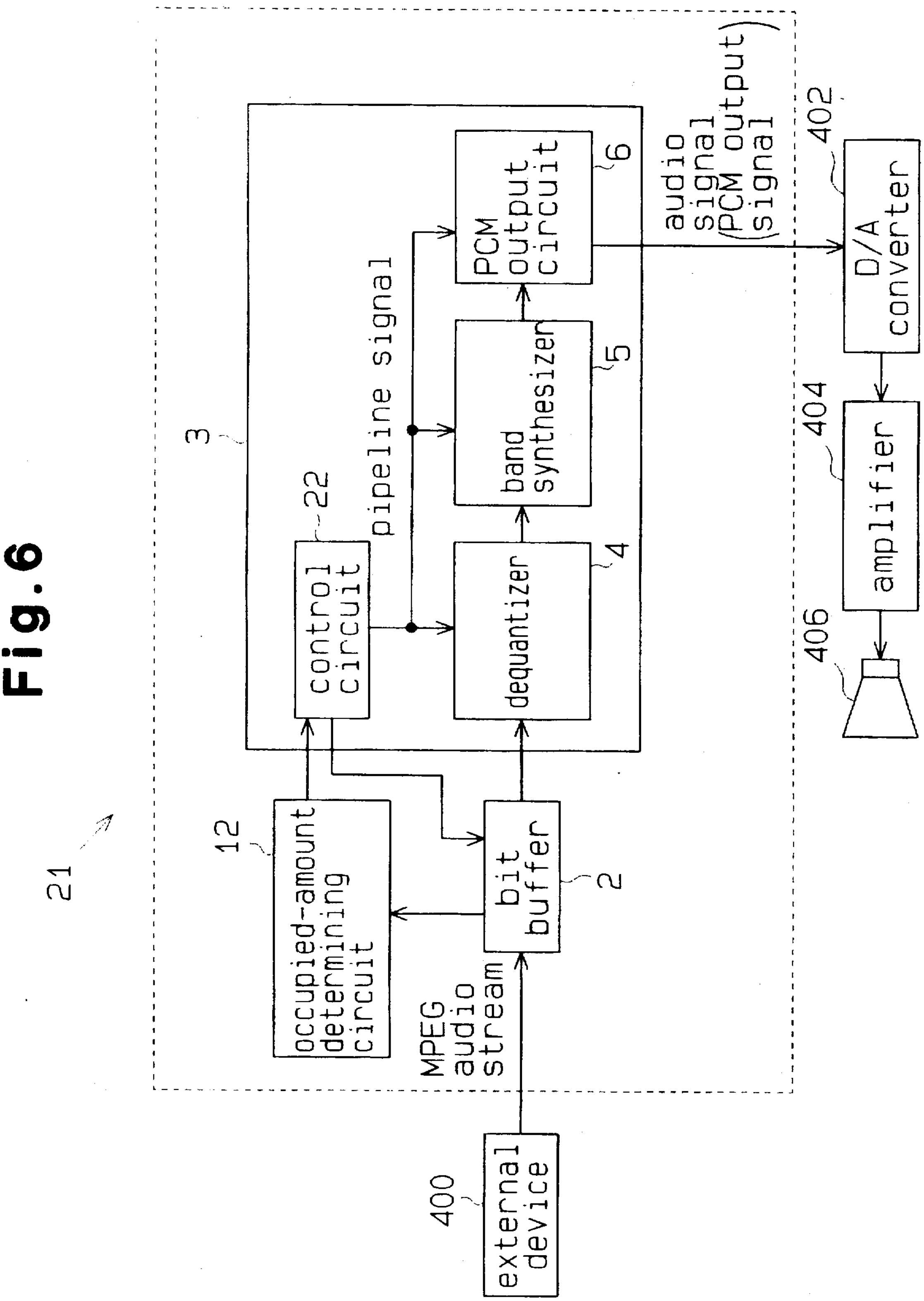
FIG. 6 is a block diagram showing an audio decoder according to the third embodiment of the invention.

The third embodiment of this invention will now be discussed referring to FIG. 6. To avoid a redundant description, like or same reference numerals are given to those components that are the same as the corresponding components of the first and second embodiments. As shown in FIG. 6, an MPEG audio decoder 21 according to the third embodiment comprises a bit buffer 2, a decode core circuit 3, and an occupied-amount determining circuit 12. The bit buffer 2, decode core circuit 3, and occupied-amount determining circuit 12 are mounted on a single LSI chip. The decode core circuit 3 includes a dequantizer 4, a band synthesizer 5, a PCM output circuit 6 and a control circuit 22. The occupied-amount determining circuit 12 and the control circuit 22 form a speed control circuit.

An audio stream transferred from the external device 400 is supplied directly to the bit buffer 2. The occupied-amount determining circuit 12 detects the occupied amount B of the audio stream in the bit buffer 2, and determines whether or not the bit buffer 2 may overflow based on the detection result.

The control circuit 22 detects the header affixed to the top of each AAU included in the audio stream stored in the bit buffer 2, and reads the audio stream from the bit buffer 2 AAU by AAU in accordance with the result of the header detection. The control circuit 22 receives the determination result from the occupied-amount determining circuit 12. According to the determination result, the control circuit 22 produces a pipeline signal, which has pulses indicating a shorter generation period as the occupied amount B of the bit buffer 2 increases. The operations of the dequantizer 4, the band synthesizer 5 and the PCM output circuit 6 are controlled by the pipeline signal. That is, the operation speeds of the individual units 4, 5 and 6 correspond to the pulse generation period for the pipeline signal. As the occupied amount B of the bit buffer 2 becomes larger, the pipeline signal whose pulses indicate a shorter generation period is produced, making the operation speeds of the individual units 4, 5 and 6 faster. This allows an audio stream to be read from the bit buffer 2 at a high speed and thus prevents the bit buffer 2 from overflowing.

The speed of reading an audio stream from the bit buffer 2 depends on the processing speed of the decode core circuit 3 (the dequantizer 4, band synthesizer 5 and PCM output circuit 6). When the operation speeds of the individual units 4, 5 and 6 become faster, therefore, the speed of reading an audio stream becomes quicker. According to the third embodiment, as discussed above, even when the bit rate of an audio stream is greater than the specified value, an audio stream is read out from the bit buffer 2 at a speed equal to or faster than the bit rate. This scheme prevents the bit buffer 2 from overflowing.

In the third embodiment, the bit rate of an audio signal becomes greater by the degree by which the processing speed of the decode core circuit 3 becomes faster. This increases the pitch of reproduced sounds and the sound generating speed (voice speed). When the processing speed of the decode core circuit 3 becomes too fast, the reproduced sounds may not be pleasant to the user though the reproduced sounds are not cut off. In this respect, it is preferable that through the actual hearing experiences, the pulse generation period of the pipeline signal be set short enough not to make the sound unpleasant.

Fourth Embodiment

Figure 7:
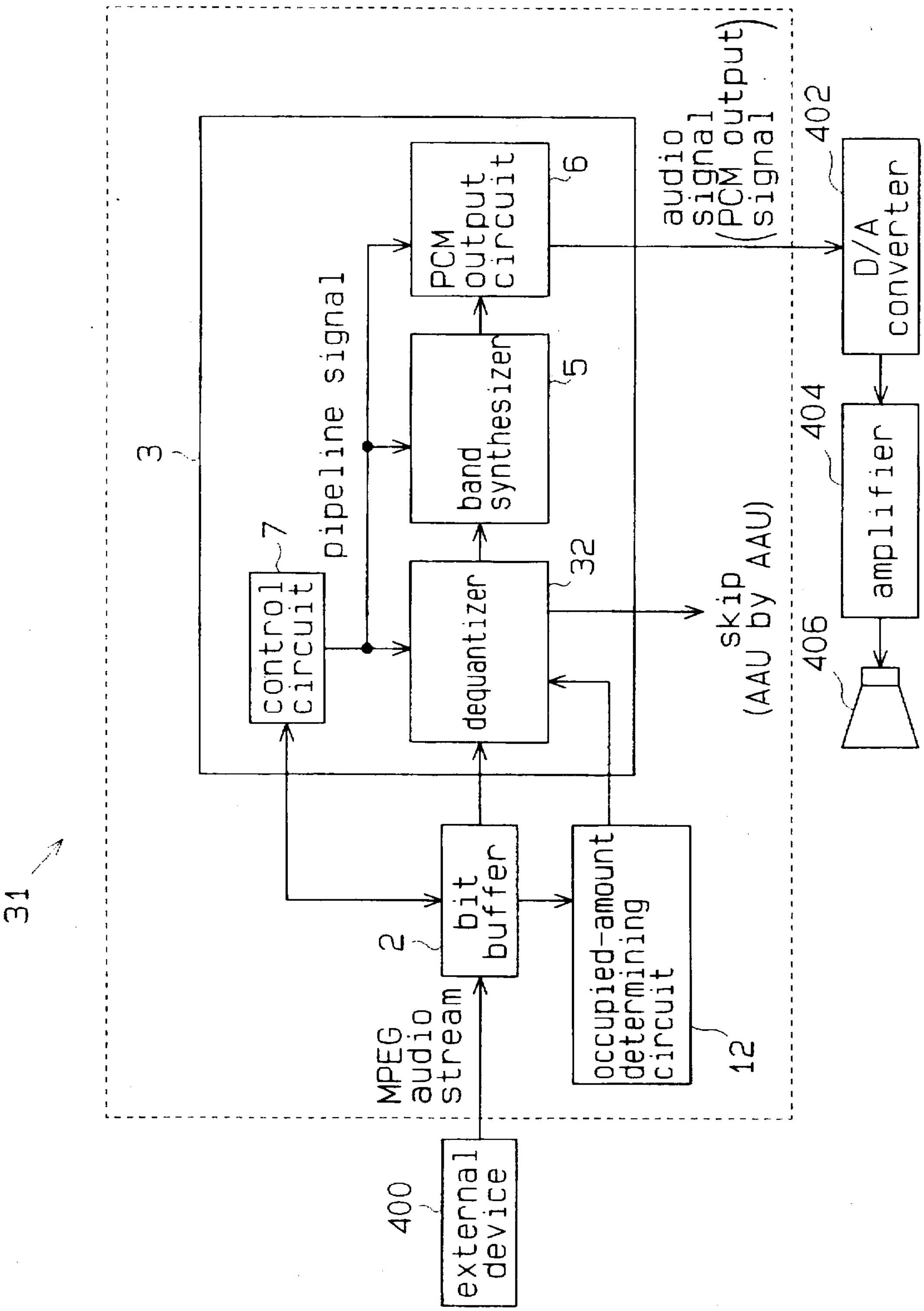
FIG. 7 is a block diagram showing an audio decoder according to the fourth embodiment of the invention.

The fourth embodiment of this invention will be now discussed referring to FIG. 7. To avoid the redundant description, like or same reference numerals are given to those components which are the same as the corresponding components of the first to third embodiments. As shown in FIG. 7, an MPEG audio decoder 31 according to the fourth embodiment comprises a bit buffer 2, a decode core circuit 3, and an occupied-amount determining circuit 12. The bit buffer 2, the decode core circuit 3, and the occupied-amount determining circuit 12 are mounted on a single LSI chip. The decode core circuit 3 includes a dequantizer 32, a band synthesizer 5, a PCM output circuit 6 and a control circuit 7.

An audio stream transferred from the external device 400 is supplied directly to the bit buffer 2. The occupied-amount determining circuit 12 detects the occupied amount B of the audio stream in the bit buffer 2, and determines whether or not the bit buffer 2 may overflow based on the detection result.

The dequantizer 32 performs dequantization, the opposite process to that of the encoder, on each AAU read from the bit buffer 2 to produce a dequantized AAU. Based on the determination result from the occupied-amount determining circuit 12 and the scale factor associated with each AAU included in audio data, the dequantizer 32 determines whether each AAU should be subjected to dequantization or should be skipped.

The scale factor indicates a value corresponding to the sound pressure level of a sound to be reproduced. Therefore, a scale factor value equal to or smaller than a predetermined value indicates that the reproduced sound of the associated AAU has a sound pressure level inaudible to people (i.e., soundless). In other words, even if a soundless AAU is skipped, the interval of sounds to be reproduced (the period in which sounds are present) does not change.

The dequantizer 32 skips a soundless AAU when the occupied amount of an audio stream is equal to or greater than a predetermined value and the scale factor value is equal to or smaller than a predetermined value. This skipping eliminates the need for the band synthesizer 5 and the PCM output circuit 6 to process the soundless AAU, thus improving the processing speeds of the band synthesizer 5 and the PCM output circuit 6. This increased processing speed improves the speed of reading an audio stream from the bit buffer 2. Even when the bit rate of an audio stream is greater than the specified value, therefore, an audio stream is read out from the bit buffer 2 at a speed equal to or faster than the bit rate. This scheme prevents the bit buffer 2 from overflowing.

When a soundless AAU is skipped, sounds to be reproduced do not involve any soundless period (where no sounds are present). The elimination of the soundless period sounds to the user unnatural. The dequantizer 32 skips a soundless AAU only when the determination result from the occupied-amount determining circuit 12 indicates probable occurrence of the overflow of the bit buffer 2. This skipping prevents the bit buffer 2 from overflowing while keeping the sounds to be reproduced as natural as possible.

The band synthesizer 5 receives dequantized AAUs from the dequantizer 32 and performs a product-sum operation called "butterfly operation". The band synthesizer 5 further combines individual pieces of audio data which has been split to 32 subbands as a operation result to produce combined audio data.

Fifth Embodiment

Figure 8:
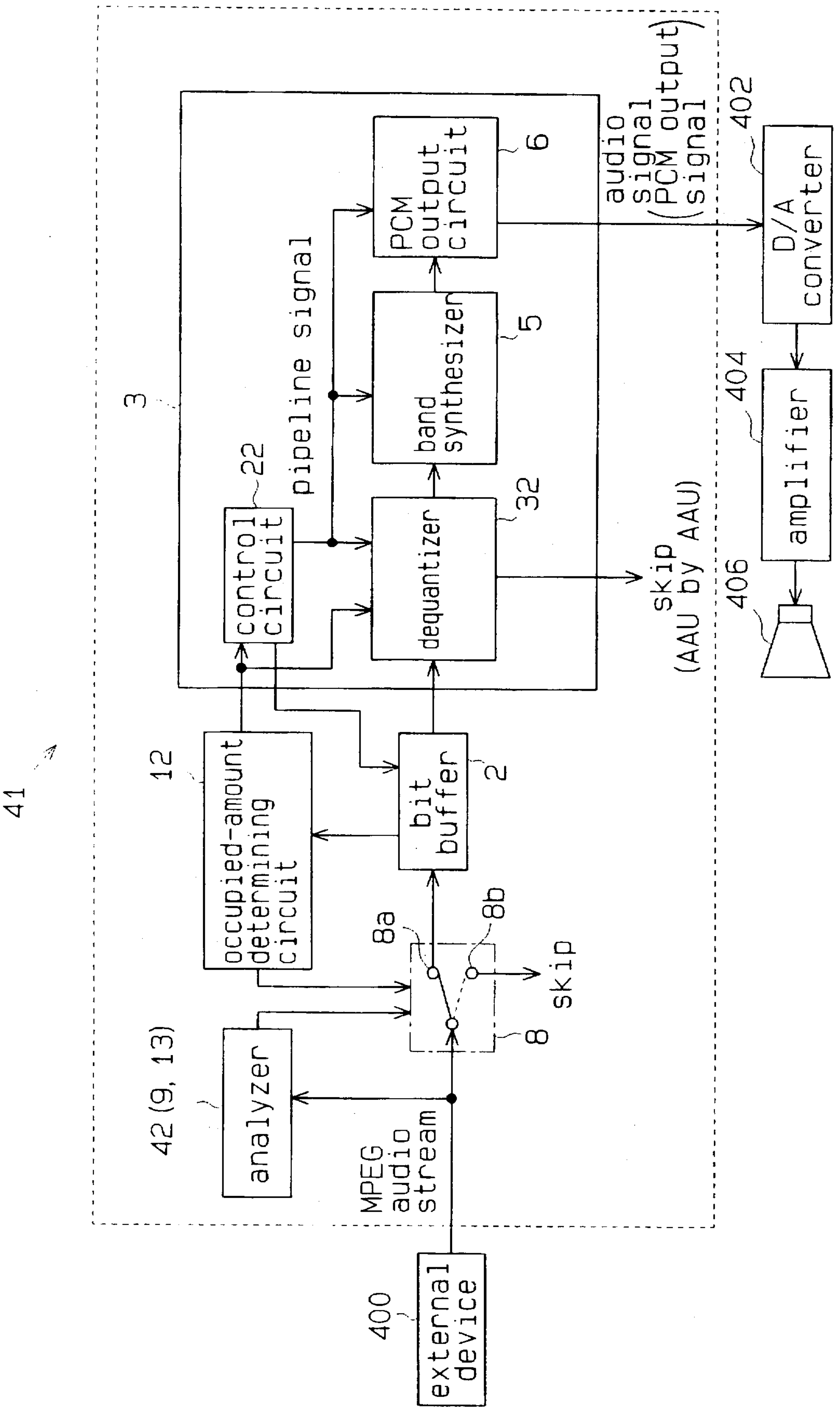
FIG. 8 is a block diagram showing an audio decoder according to the fifth embodiment of the invention.

FIG. 8 presents a block diagram showing an MPEG audio decoder 41 according to the fifth embodiment, which is the combination of all of the first to fourth embodiments. The MPEG audio decoder 41 comprises a bit buffer 2, a decode core circuit 3, an occupied-amount determining circuit 12, an analyzer 42 and a skip circuit 8. The decode core circuit 3 has a dequantizer 32, a band synthesizer 5, a PCM output circuit 6 and a control circuit 22. The analyzer 42 has the functions of both analyzers 9 and 13 of the first and second embodiments.

MPEG System Decoder Including Audio Decoder

Figure 9:
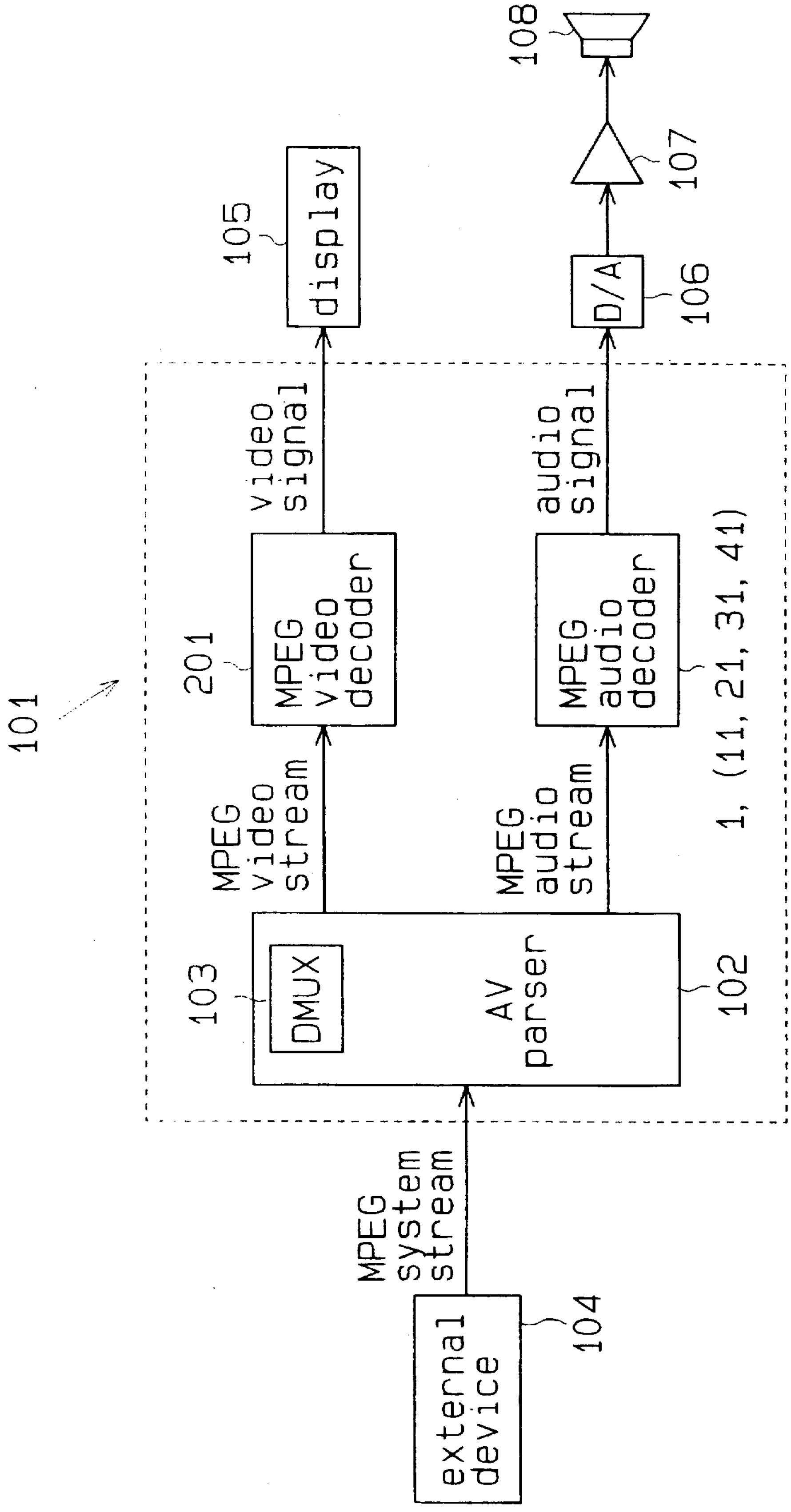
FIG. 9 is a block diagram illustrating a system decoder which has the audio decoder according to one of the first to fifth embodiments and a video decoder.

As shown in FIG. 9, an MPEG system decoder 101 has an audio video parser (AV parser) 102, an MPEG video decoder 201, and an MPEG audio decoder. This MPEG audio decoder is one of the MPEG audio decoders 1, 11, 21, 31 and 41 of the first to fifth embodiments.

The AV parser 102, which has a demultiplexer (DMUX) 103, receives an MPEG system stream transferred from an external device 104. The DMUX 103 separates the system stream to an MPEG video stream and an MPEG audio stream, and supplies the video stream to the video decoder 201 and the audio stream to the audio decoder 1 (11, 21, 31 or 41). The video decoder 201 decodes the video stream in conformity to the MPEG video part to produce a video signal. This video signal is sent to a display 105 to be reproduced as a moving picture thereon.

The audio decoder 1 (11, 21, 31 or 41) decodes the audio stream to produce an audio signal. This audio signal is subjected to D/A conversion by a D/A converter 106, and the resultant signal is then amplified by an audio amplifier 107 before being sent to a loudspeaker 108. The amplified signal is reproduced as sounds from the loudspeaker 108.

The bit rate of the system stream transferred from the external device 104 corresponds to the reading speed of the external device 104. The bit rates of the video stream and audio stream are the same as the bit rate of the system stream. Therefore, the video decoder 201 produces video output signals at the rate corresponding to the bit rate of the system stream. When the bit rate of the system stream is greater than the one in the normal reproduction mode (standard reproduction), moving pictures are reproduced at a high speed on the display 105. When the bit rate of the system stream is smaller than the one in the normal reproduction mode, on the other hand, moving pictures are reproduced at a low speed on the display 105.

MPEG Video Decoder According to The First Example

Figure 10:
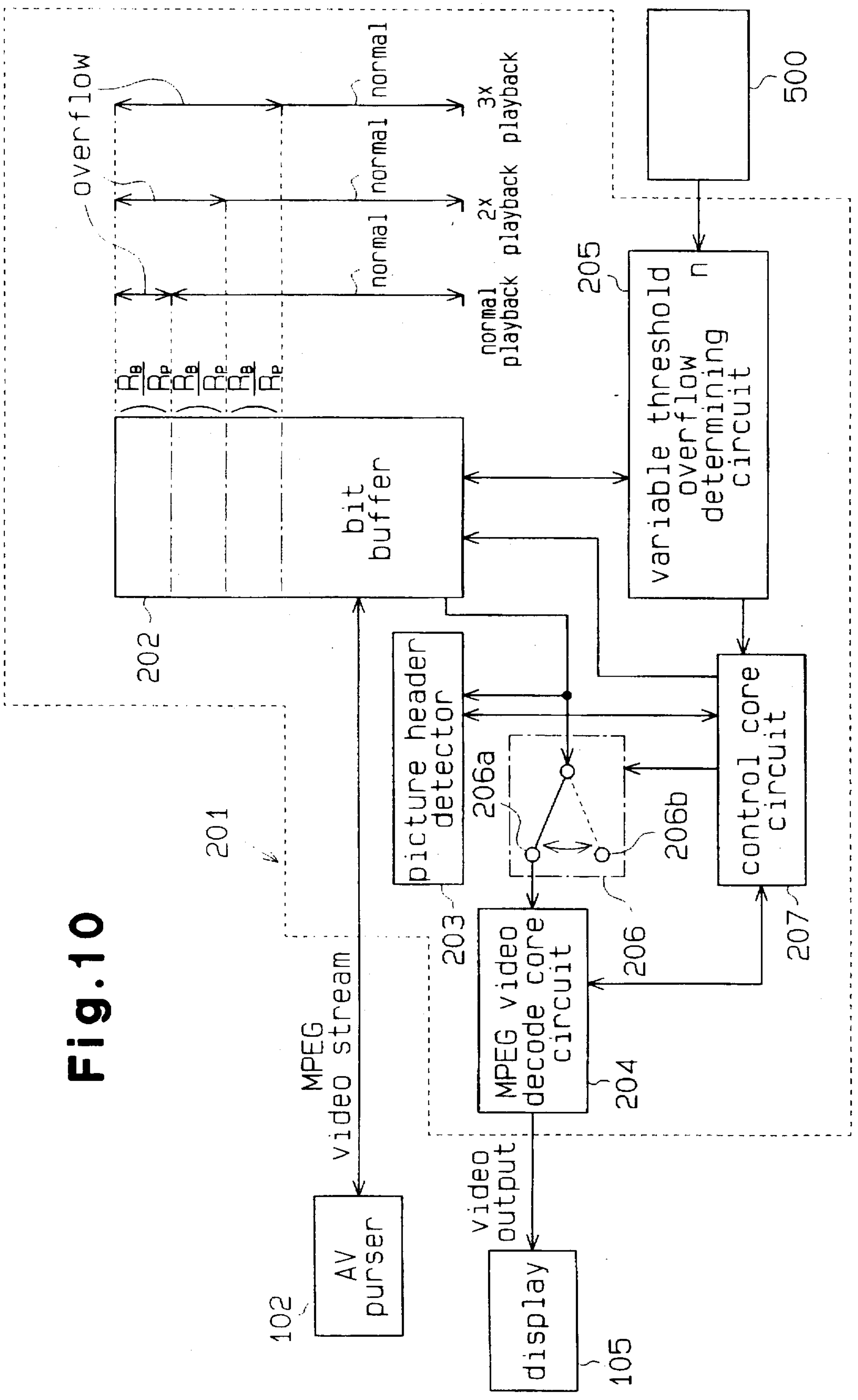
FIG. 10 is a block diagram showing the video decoder in FIG. 9.

FIG. 10 is a block diagram showing a MPEG video decoder 201 having a fast playback function. The MPEG video decoder 201 according to the first example comprises a bit buffer 202, a picture header detector 203, an MPEG video decode core circuit 204, a variable threshold overflow determining circuit (hereinafter called determining circuit) 205, a picture skip circuit 206, and a control core circuit 207. Those circuits 203 to 207 are preferably mounted on a single large-scale integration (LSI) chip. The control core circuit 207 controls the individual circuits 202 to 206. An MPEG video stream transferred from AV parser 102 is supplied to the bit buffer 202.

The bit buffer 202 is a ring buffer equipped with RAM (Random Access Memory) having a FIFO structure for sequentially storing a video stream. The picture header detector 203 detects a picture header at the head of each picture included in the video stream that is stored in the bit buffer 202. The picture header defines the type as one of I-, P- and B-pictures.

In accordance with a detection signal from the picture header detector 203 and a decision signal of the determining circuit 205, which will be discussed later, the control core circuit 207 controls the bit buffer 202 in such a way as to read a video stream corresponding to the proper number of pictures every frame period. The video stream read from the bit buffer 202 remains in bit buffer 202 after reading. The video stream of each picture read from the bit buffer 202 is transferred via the picture skip circuit 206 to the decode core circuit 204.

The decode core circuit 204 receives the video stream of each picture and decodes it in conformity to the MPEG video part to produce a video output signal picture by picture,. This video output signal is supplied to a external display 105 which is connected to the MPEG video decoder 201.

The picture skip circuit 206 has a first node **206*a* and a second node 206*b* and selectively switches the connection to the nodes 206*a* and 206*b* under the control of the control core circuit 207. When the picture skip circuit 206 is set to the first node 206*a*, pictures are transferred to the decode core circuit 204 from the bit buffer 202. When the picture skip circuit 206 is set to the second node 206*b*, on the other hand, pictures are not transferred to the decode core circuit 204 and are skipped. As a result, a video stream to be transferred to the decode core circuit 204 is thinned in units of pictures by the picture skip circuit 206**.

The determining circuit 205 changes a threshold value Bthn of the occupying amount Bm of pictures (video stream) in the bit buffer 202 in accordance with a playback speed signal n which is supplied from an external control device 500, and compares the actual occupying amount Bm with the threshold value Bthn. The playback speed signal n is represented by a magnification with respect to the normal playback speed. In the 2x playback mode, for example, the magnification n=2 and the threshold value Bthn becomes Bth2. In the normal playback mode, the magnification n=1 and the threshold value Bthn becomes Bth1. When the occupying amount Bm of the bit buffer 202 is not greater than the threshold value Bthn, the determining circuit 205 determines that the bit buffer 202 is unlikely to overflow and that the occupying amount is normal. In accordance with this decision, the control core circuit 207 controls the bit buffer 202 in such a way as to read out a video stream for one picture. Further, the control core circuit 207 sets the picture skip circuit 206 to the first node 206*a* so that pictures are transferred to the decode core circuit 204.

Figure 11:
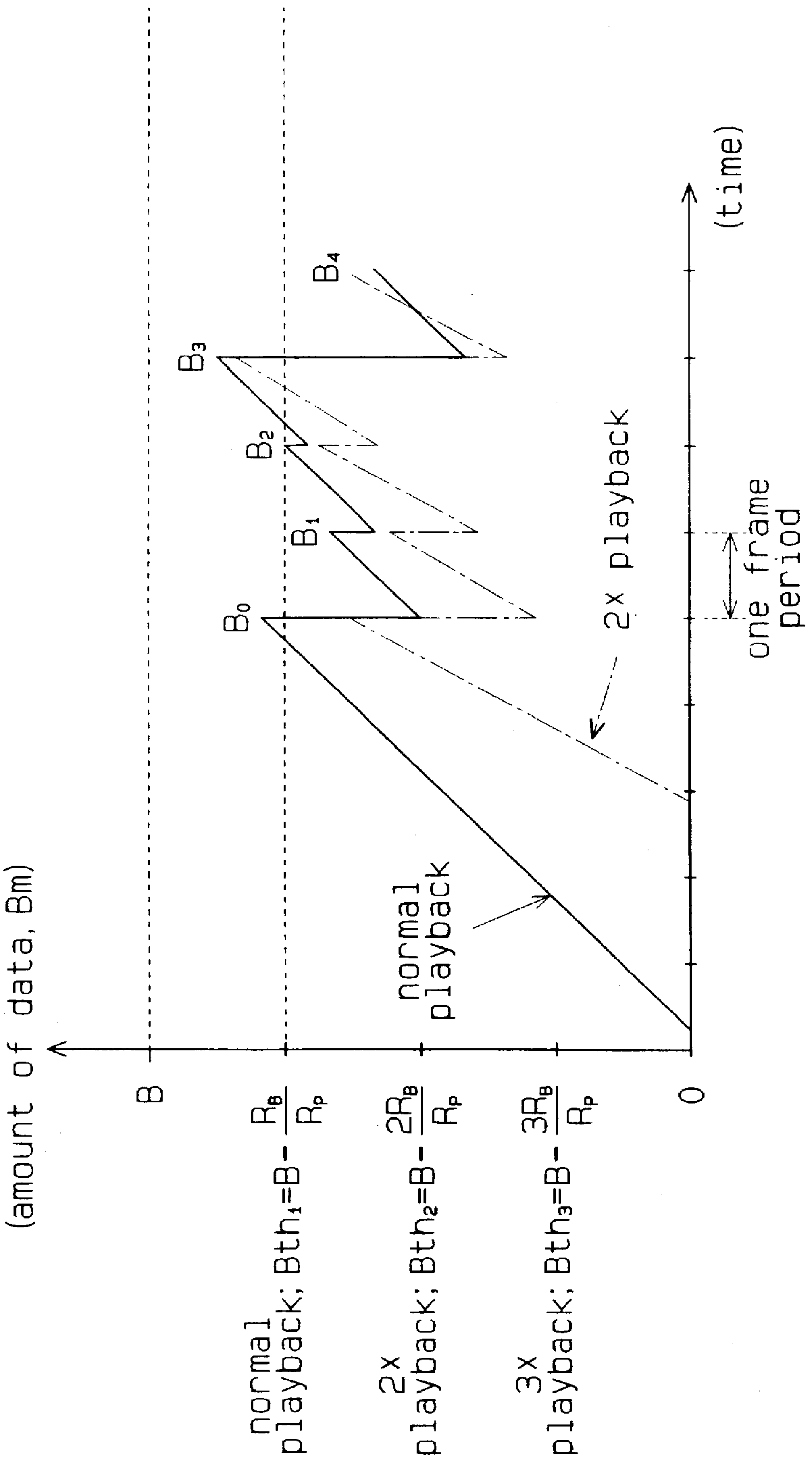
FIG. 11 is a graph showing the relationship between the occupied amount of a video stream in a bit buffer in the first example of the video decoder and time.

FIG. 11 is a graph showing the relationship between the occupying amount of a video stream in the bit buffer 202 and the time in the normal playback mode according to the first example.

The occupying amount Bm of the bit buffer 202 rises at the bit rate $R_B$, which represents the slope of the graph. The bit rate $R_B$ of a video stream is defined as given by an equation (1) below $$R_B=400\times BR \quad (1)$$

where BR is the bit rate of a sequence header provided at the head of a sequence.

The capacity B of the bit buffer 202 is defined as given by the following equation (2)

$$B=16\times 1024\times VBS \quad (2)$$

where VBS is the video buffering verifier (VBV) buffer size of the sequence header.

The amount of data, X, of a video stream to be supplied to the bit buffer 202 in one frame period is defined as given by the following equation (3)

$$X=R_B/R_P \quad (3)$$

where $R_P$ is the picture rate of a video stream which is defined by the picture rate of the sequence header. A video stream for one picture is read from the bit buffer 202 without pause in one frame period, and is decoded by the decode core circuit 205. The occupying amount Bm immediately after the continuous reading of the video stream is defined as given by the following equation (4). The occupying amount Bm is indicated by "$B_0$" to "$B_6$" as shown in FIG. 11.

$$0<Bm<B-X=B-(R_B/R_P) \quad (4)$$

Defining the occupying amount Bm so as to satisfy the condition of the equation (4) prevents the overflow and underflow of the bit buffer 202. In other words, the occupying amount Bm that exceeds a threshold value represented by B−X indicates a high probability that the bit buffer 202 would overflow.

In the normal playback mode, the bit rate $R_B$, the picture rate $R_P$ and the capacity B are so defined as to meet the equation (4). Further, setting the capacity B of the bit buffer 202 as given by the equation (2) prevents the overflow and underflow of the bit buffer 202 even if the picture skip circuit 206 is kept set to the first node.

In the normal playback mode, the occupying amount Bm, indicated by $B_0$ to $B_4$, immediately after the continuous reading of one picture of data from the bit buffer 202 is defined based on the threshold value Bth1 so as to satisfy the following equation (5).

$$0<Bm<Bth1<B \quad (5)$$

The threshold value Bth1 is set as expressed by an equation (6) below in association with the equation (4).

$$Bth1=B-X=B-(R_B/R_P) \quad (6)$$

Actually, even if the capacity B is set as given by the equation (2), the bit buffer 202 may overflow when the picture skip circuit 206 is kept set to the first node 206*a*.

According to the video decoder 201 of the first example, when the occupying amount Bm of the bit buffer 202 exceeds the threshold value First, the determining circuit 205 determines that the bit buffer 202 is apt to overflow in the normal playback mode. Then, the control core circuit 207 controls the bit buffer 202 in such a manner that a video stream for the proper number of pictures is read out from the bit buffer 202 to set the occupying amount Bm smaller than the threshold value Bth1. Further, the picture skip circuit 206 is switched to the second node 206*b* to skip all the read pictures. Therefore, the first example prevents the bit buffer 202 from overflowing in the normal playback mode.

The occupying amount Bm in the fast playback mode rises at the bit rate $n\times R_B$ of the video stream, which represents the slope of the graph. For example, the occupying amount Bm in the 2x playback mode rises along the graph whose slope is given by the bit rate $2\times R_B$. In the fast playback mode, therefore, the occupying amount Bm, indicated by $B_0$ to $B_4$, immediately after the continuous reading of one picture of data from the bit buffer 202 is defined based on the threshold value Bthn so as to satisfy an equation (7) below.

$$0<Bm<Bthn \quad (7)$$

The threshold value Bthn is set as expressed by the following equation (8).

$$Bthn=B-n\times X=B-(n\times R_B/R_P) \quad (8)$$

When the occupying amount Bm exceeds the threshold value Bthn in the fast playback mode, the determining circuit 205 determines that the bit buffer 202 may overflow. This may occur, for example, when the occupying amount Bm exceeds the threshold value Bth2 ($=B-(2\times R_B/R_P)$) in the 2x playback mode and when the occupying amount Bm exceeds the threshold value Bth3 ($=B-(3\times R_B/R_P)$) in the 3x playback mode. In accordance with the decision signal, the control core circuit 207 controls the bit buffer 202 in such a manner that a video stream for the proper number of pictures is read out from the bit buffer 202 and is skipped to set the occupying amount Bm smaller than the threshold value Bthn. This control prevents the bit buffer 202 from overflowing in the fast playback mode. In the normal playback mode and fast playback mode, the control core circuit 207 can easily control the bit buffer 202 and the picture skip circuit 206 based on the threshold value. This design eliminates the need for a microcomputer for the control core circuit 207. Further, the mounting of the individual circuits 203 to 207 on a single LSI chip in the first example contributes to reducing the manufacturing cost and making the overall apparatus compact.

The overflow of the bit buffer 202 should be avoided at any cost especially while the decode core circuit 204 is decoding an arbitrary picture. Suppose that the bit buffer 202 overflows while the decode core circuit 204 is decoding an arbitrary picture. Then, although some of the video stream of the picture that is being decoded still remains in the bit buffer 202, it is overwritten with a newly supplied video stream. Consequently, the remaining video stream of that picture is destroyed and lost. It therefore becomes impossible for the decode core circuit 204 to finish decoding the picture, thus disabling the production of the video output of the picture.

According to the first example, therefore, the determining circuit 205 checks the free space in the bit buffer 202 when the picture header detector 203 detects a picture header to determine if there is a sufficient space ($n\times X=n\times R_B/R_P$) secured. When the determining circuit 205 determines that there is insufficient space, the control core circuit 207 skips the picture read from the bit buffer 202 via the picture skip circuit 206 based on that picture header. Next, the determining circuit 205 checks the free space in the bit buffer 202 again when the picture header detector 203 detects the next picture header. The time needed for those decisions and the skipping process is considerably shorter than the time for the decoding process by the decode core circuit 204. Therefore, no problem will arise even when the decoding process starts after a sufficient space is secured in the bit buffer 202.

The reason why the free space in the bit buffer 202 is checked is that the amount of picture data is not constant. The amount of data of one picture ranges from 0 to 40 bytes, and this amount becomes apparent when the decode core circuit 204 finishes the decoding. Further, the time for decoding one picture is normally about ⅓ to ¾ of one frame period though it varies in accordance with the amount of data of that picture and the operation speed of the decode core circuit 204. When the amount of data of a picture is 0 bytes, for example, the occupying amount Bm of the bit buffer 202 before the reading of this picture does not differ from that after the picture reading. Therefore, skipping the picture of 0 bytes makes it impossible to avoid the overflow of the bit buffer 202. In other words, when the bit buffer 202 has enough free space for the amount of data that is supplied in one frame period, it is possible to avoid the overflow of the bit buffer 202 regardless of the amount of data of a read picture.

The amount of data of a video stream to be supplied to the bit buffer 202 in one frame period is $n\times X=n\times R_B/R_P$. The overflow of the bit buffer 202 can therefore be avoided if the bit buffer 202 has free space equal to or greater than this data amount. This free space is the capacity B of the bit buffer 202 minus the threshold value Bthn as given by the equation (8). When the occupying amount Bm is not greater than the threshold value Bthn, therefore, the determining circuit 205 determines that a sufficient free space is secured in the bit buffer 202. That is, setting the threshold value Bthn as indicated by the equation (8) can surely avoid the overflow of the bit buffer 202.

According to the first example, it is determined if the bit buffer 202 is likely to overflow, before the decode core circuit 204 starts decoding an arbitrary picture. More specifically, the decision on the overflow of the bit buffer 202 is made when the picture header detector 203 detects a picture header, and it is then determined whether or not to skip the picture in accordance with the decision. This approach prevents the video stream of a picture being transferred to the decode core circuit 204 from being interrupted during the transfer. The decode core circuit 204 therefore can decode a P-picture and a B-picture as well as an I-picture. As a result, the occurrence of frame dropping will be decreased. At the time of a fast playback two to four times faster than the normal playback, it is possible to display pictures at a rate of several frames per second. It is thus possible to attain moving pictures which show a smooth motion in the fast playback mode, and to significantly improve the picture quality.

The bit buffer 202 may underflow when the picture header detector 203 detects a picture header or after the decode core circuit 204 starts decoding. The problem of underflow is solved by successive reading of a video stream for one picture from the bit buffer 202 as soon as a video stream is provided to the bit buffer 202.

MPEG Decoder According to The Second Example

The MPEG decoder according to the second example will now be described. The MPEG video decoder according to the second example has the same general structure as that of the first example. The video stream determining circuit 205 in the second example however uses two threshold values B2thn and B3thn, which are so set as to meet the condition given in an equation (9).

$$0<B3thn<B2thn<B \tag{9}$$

It is preferable that those threshold values B2thn and B3thn are set in accordance with the playback speed as in the first example and also based on the result of the actual check on the quality of moving pictures to be displayed on the display 105. The determining circuit 205 compares the occupying amount Bm of the bit buffer 202 with the threshold values B2thn and B3thn and determines which one of the following three cases C1 to C3 the current case is.

Case C1 (Bm<B3thn):

When the occupying amount Bm of the bit buffer 202 does not exceed the threshold value B3thn, the determining circuit 205 determines that the bit buffer 202 is unlikely to overflow and is normal. In accordance with this decision, the control core circuit 207 controls the bit buffer 202 in such a way as to read a video stream for one picture from the bit buffer 202. Further, the control core circuit 207 switches the picture skip circuit 206 to the first node **206*a* to transfer the video stream of that picture to the decode core circuit 204**.

Case C2 (B2thn<Bm):

When the occupying amount Bm has exceeded the threshold value B2thn, the determining circuit 205 sets a first flag as long as the picture read from the bit buffer 202 is an I- or P-picture. When and only when the first flag is set and a picture read following the I- or P-picture is a B-picture, the control core circuit 207 skips that B-picture even if the occupying amount Bm becomes smaller than the threshold value B3thn.

Case C3 (B3thn<Bm<B2thn):

When the occupying amount Bm is greater than the threshold value B3thn but is not greater than the threshold value B2thn, the determining circuit 205 sets a second flag as long as the read picture is a P-picture. When and only when the second flag is set and a picture read following the P-picture is a B-picture, the control core circuit 207 skips that B-picture even if the occupying amount Bm becomes smaller than the threshold value B3thn.

Figure 12:
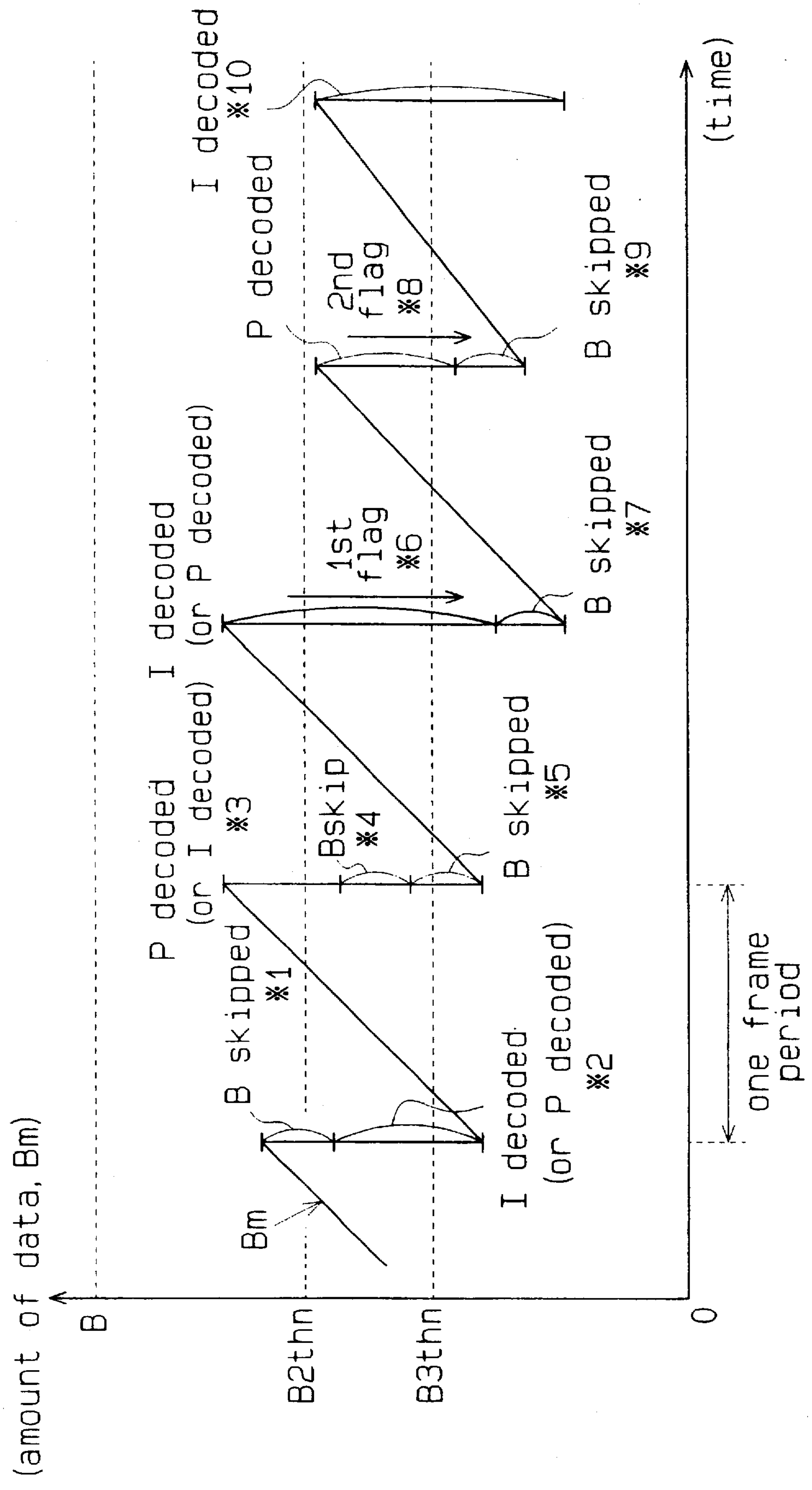
FIG. 12 is a graph showing the relationship between the occupied amount of a video stream in a bit buffer in the second example of the video decoder and time.

FIG. 12 is a graph showing the relationship between the occupying amount of a video stream in the bit buffer 202 according to the second example and time.

When the occupying amount Bm is greater than the threshold value B3thn, if it is a B-picture which has been read, this B-picture is not decoded but is skipped (see *1 in FIG. 12). When the occupying amount Bm is still greater than the threshold value B3thn even after the skipping of the B-picture, an I- or P-picture read after that B-picture is decoded (see *2).

When the occupying amount Bm is greater than the threshold value B3thn, if it is an I- or P-picture which has been read, this picture is decoded (see *3 in the diagram). When the occupying amount Bm is still greater than the threshold value B3thn even after the decoding of the I- or P-picture, a B-picture read after that I- or P-picture is not decoded but is skipped (see *4). The skipping of this B-picture is repeated until the occupying amount Bm becomes smaller than the threshold value B3thn (see *5).

The reason why a B-picture is skipped with priority over an I- or P-picture is because the data of a B-picture produced by the bidirectional prediction has a lower significance than the data of I- and P-pictures. The skipping of a B-picture with priority over an I- or P-picture permits I- and P-pictures to be decoded as much as possible. Therefore, the number of frames that are dropped from moving pictures to be displayed becomes less than that in the first example. Accordingly, it is possible to attain moving pictures that show a smoother motion in the fast playback mode with a higher picture quality.

When the occupying amount Bm becomes greater than the threshold value B2thn, if it is an I- or P-picture that has been read, this picture is decoded and the determining circuit 205 sets the first flag (see *6 in the diagram). When the first flag is set and a B-picture is read after the I- or P-picture, this B-picture is skipped even if the occupying amount Bm becomes smaller than the threshold value B3thn (see *7). The previous skipping of the B-picture that is read after an I- or P-picture can secure a greater free space to prevent the overflow thereof.

When the occupying amount Bm becomes greater than the threshold value B3thn but is smaller than the threshold value B2thn, if it is a P-picture that has been read, this picture is decoded and the determining circuit 205 sets the second flag (see *8 in the diagram). When the second flag is set and a B-picture is read after the P-picture, this B-picture is skipped even if the occupying amount Bm becomes smaller than the threshold value B3thn (see *9). The previous skipping of the B-picture that is read after a P-picture can reduce the occupying amount Bm as much as possible to prevent the bit buffer 202 from overflowing. This overflow prevention scheme avoids overflow of the bit buffer 202.

When the occupying amount Bm becomes greater than the threshold value B3thn but is smaller than the threshold value B2thn, if it is an I-picture which has been read, this picture is decoded and the determining circuit 205 does not set the second flag (see *10 in the diagram). When the second flag is not set and when the occupying amount Bm is smaller than the threshold value B3thn, a B-picture read after the I-picture is decoded without being skipped.

The first and second flags are set in the above-described manner in order to make the condition for skipping a B-picture after the reading of an I-picture different from the condition for skipping a B-picture after the reading of a P-picture. This will be discussed below more specifically. The amount of data of an I-picture is two to three times that of a P-picture. Thus, the degree of the reduction of the occupying amount Bm after the reading of an I-picture is greater than that after the reading of a P-picture. In other words, the probability of the overflow of the bit buffer 202 after the reading of an I-picture is smaller than that after the reading of a P-picture. In this respect, the reference value or the threshold value B2thn for setting the first flag in association with an I-picture is set higher than the reference value or the threshold value B3thn for setting the second flag in association with a P-picture. Accordingly, the condition for skipping a B-picture after the reading of an I-picture becomes more relaxed than the skipping condition after the reading of a P-picture. Even if the occupying amount Bm is smaller than the threshold value B3thn, the number of B-pictures which are to be skipped unnecessarily for the prevention becomes smaller. In other words, the number of B-pictures to be decoded is increased.

The following shows the results of a simulation conducted in the fast playback mode according to the second example. A1 and A2 indicate the types of the GOP structure of a video stream read from a recording medium.

A1: IBPBPBPBP . . .

A2: IBBPBBPBBPBBPBBIBP . . .

[1] In 2x playback mode: For the type A1, all of I- and P-pictures are decodable so that moving pictures are displayed at a full rate of 30 frames per second. For the type A2, all of I- and P-pictures and some of B-pictures are decodable so that moving pictures are displayed at a rate of 25 or more frames per second.

[2] In 4x playback mode: For both the types A1 and A2, an I-picture and the subsequent three to four P-pictures are decodable so that moving pictures are displayed at a rate of 15 or more frames per second.

Although only five embodiments of the present invention have been described herein, it should be apparent to those skilled in the art that the present invention may be embodied in many other specific forms without departing from the spirit or scope of the invention. Particularly, it should be understood that this invention may be embodied in the following forms.

Two or more of the first to fourth embodiments may be combined.

In the first to fifth embodiments, the signal processing in individual circuits 2 to 32 may be replaced with software-based signal processing which is accomplished by using a CPU.

In the first, second and fifth embodiments, for the purpose of easier understanding, the skip circuit 8 is designed to have first and second nodes **8*a* and 8*b* which are selectively switched from one to the other in accordance with the data contents. Instead, the skip circuit 8 may be constituted of a logic circuit that passes only the necessary data in an audio stream in accordance with the signal coming from the analyzer 9, 13 or 14. Likewise, a picture skip circuit 206 shown in FIG. 10** may be constituted of a logic circuit that passes only picture data to be decoded.

Figure 13:
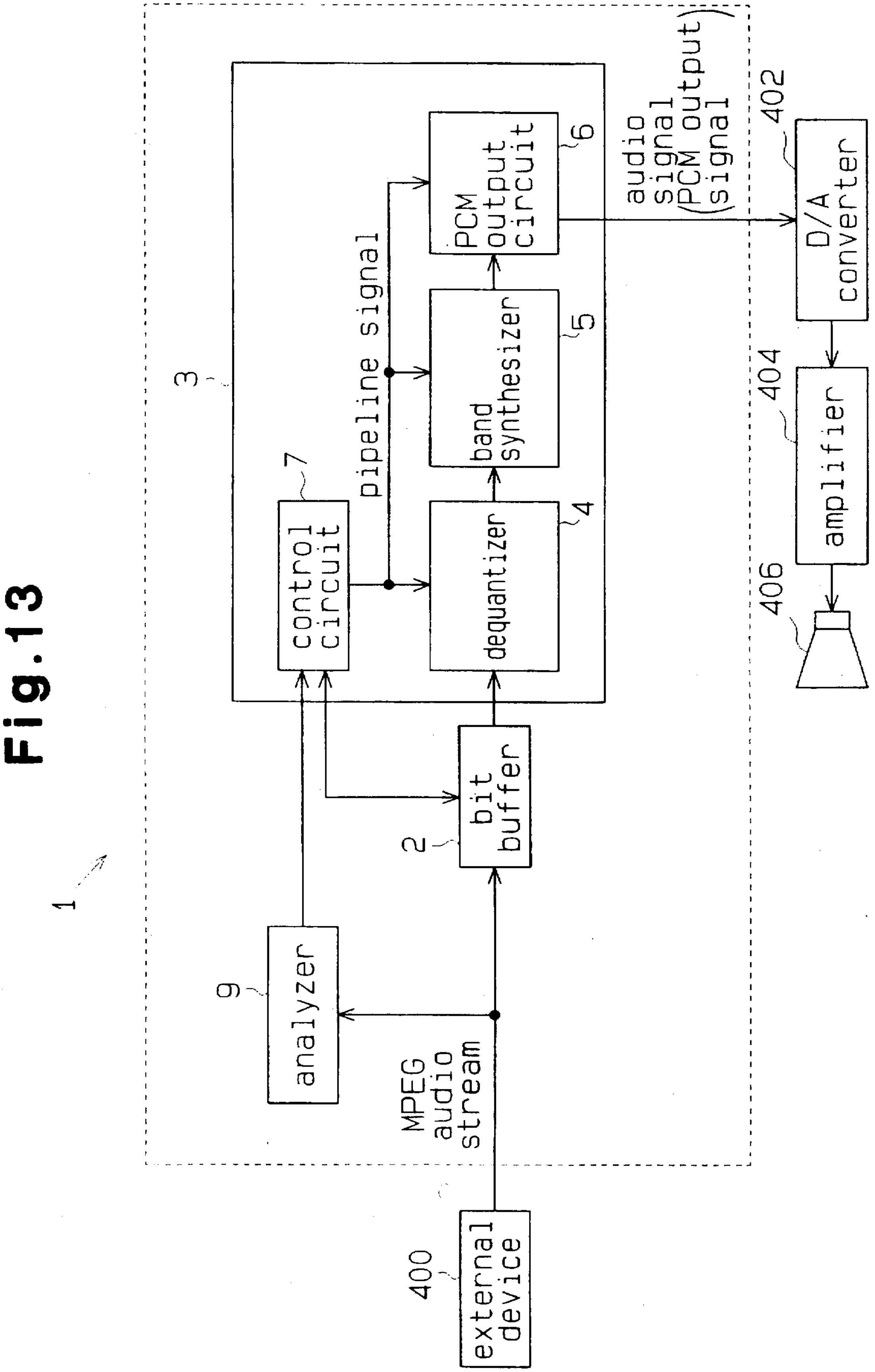
FIG. 13 is a block diagram showing an audio decoder according to the another embodiment of the invention.

Further, the skip circuit 8 may be omitted from the first, second and fifth embodiments, and the control circuit 7 or 22 may be designed to have the same function as that of the skip circuit 8 as shown in FIG. 13. In this case, the control circuit 7 or 22 is connected to the associated analyzer 9, 13 or 42, and when necessary data is supplied to the bit buffer 2 based on the analyzing result from the analyzer 9, 13 or 42, the necessary data is stored at the proper address $A_n$ in the bit buffer 2. When unnecessary data is supplied based on the analyzing result, the control circuit 7 temporarily stores the unnecessary data at the next address $A_{n+1}$, to the proper address $A_n$ where the necessary data should be stored. Subsequently, when another necessary data is newly supplied next, the control circuit 7 or 22 performs the memory control of the bit buffer 2 so that the unnecessary data stored at the next address $A_{n+1}$ is replaced with the new necessary data.

When another unnecessary data is supplied while unnecessary data is already stored at the next address $A_{n+1}$, the control circuit 7 or 22 performs the memory control of the bit buffer 2 so that the unnecessary data stored at the next address $A_{n+1}$ is replaced with the new unnecessary data. This rewriting of unnecessary data under the memory control prevents the bit buffer 2 from overflowing. The "unnecessary data" mentioned here is the data that should be skipped by the skip circuit 8 in the individual embodiments.

Therefore, the present examples and embodiments are to be considered as illustrative and not restrictive and the invention is not to be limited to the details given herein, but may be modified within the scope of the appended claims.

What is claimed is:

1. An audio decoding apparatus for decoding an audio stream including various kinds of coded data, comprising:

a bit buffer for temporarily storing said audio stream;

a decoder for receiving said audio stream from said bit buffer and decoding said audio stream to produce decoded audio data; and a data extractor, operatively coupled to said bit buffer, for extracting coded data necessary for said decoder from said audio stream and supplying said audio stream including said extracted necessary coded data to said bit buffer.

2. The audio decoding apparatus according to claim 1, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

3. An audio decoding apparatus for decoding an audio stream including a series of frames, each having various kinds of coded data, comprising:

a bit buffer for temporarily storing said audio stream;

a decoder for receiving said audio stream from said bit buffer and decoding said audio stream frame by frame to produce decoded audio data;

an analyzer for analyzing various kinds of data included in each of said frames to separate necessary coded data for said decoder from unnecessary coded data for said decoder; and skip means, operatively coupled to said bit buffer and said analyzer, for skipping said unnecessary coded data in each frame in said audio stream and supplying said necessary coded data in each frame in said audio stream to said bit buffer.

4. The audio decoding apparatus according to claim 3, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

5. An audio decoding apparatus for decoding an audio stream including a series of frames each having various kinds of coded data, comprising:

a bit buffer for temporarily storing said audio stream;

a decoder for receiving said audio stream from said bit buffer and decoding said audio stream frame by frame to produce decoded audio data;

an analyzer for analyzing various kinds of data included in each of said frames to separate necessary coded data for said decoder from unnecessary coded data for said decoder; and control means, operatively coupled to said bit buffer, for controlling said bit buffer in such a manner that only said necessary coded data in each frame in said audio stream is stored into said bit buffer and transferred to said decoder.

6. An audio decoding apparatus for decoding an audio stream, comprising:

a bit buffer for temporarily storing said audio stream;

a decoder for receiving said audio stream from said bit buffer and decoding said audio stream to produce decoded audio data; and an audio stream control circuit, operatively coupled to said bit buffer, for checking an occupied amount of said audio stream occupying said bit buffer and preventing a further amount of said audio stream from being supplied to said bit buffer while said occupied amount of said audio stream exceeds a first given amount, until said occupied amount is reduced below a second given amount.

7. The audio decoding apparatus according to claim 6, wherein said audio stream includes a plurality of frames, and said audio stream control circuit skips a part of said audio stream frame by frame in order to prevent said audio stream from being supplied to said bit buffer.

8. The audio decoding apparatus according to claim 6, wherein said audio stream includes a plurality of frames, and said audio stream control circuit operates to store some data in said audio stream frame by frame in said bit buffer and transfer said some data to said decoder frame by frame.

9. The audio decoding apparatus according to claim 6, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

10. An audio decoding apparatus for decoding an audio stream including a plurality of frames, comprising:

a bit buffer for temporarily storing said audio stream;

a decoder for receiving said audio stream from said bit buffer and decoding said audio stream frame by frame to produce decoded audio data;

a determining circuit, coupled to said bit buffer, for determining whether an amount of said audio stream stored in said bit buffer exceeds a first threshold value that is predetermined as a limit amount of said audio stream storable in said bit buffer; and skip means, operatively coupled to said determining circuit and said bit buffer, for skipping a part of said audio stream frame by frame in order to prevent said audio stream from being supplied to said bit buffer, as long as said amount of said audio stream stored in said bit buffer exceeds said first threshold value;

said determining circuit further determining whether said amount of said audio stream stored in said bit buffer is smaller than a second threshold value that is smaller than said first threshold value;

said skip means further permitting supply of said audio stream to said bit buffer when said amount of said audio stream stored in said bit buffer becomes smaller than said second threshold value.

11. The audio decoding apparatus according to claim 10, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

12. An audio decoding apparatus for decoding an audio stream, comprising:

a bit buffer for temporarily storing said audio stream;

a decoder for receiving said audio stream from said bit buffer and decoding said audio stream to produce decoded audio data; and a speed control circuit, operatively coupled to said bit buffer and said decoder, for checking an occupied amount of said audio stream occupying said bit buffer and controlling said decoder in such a way that an operational speed becomes faster as said occupied amount of said audio stream increases.

13. The audio decoding apparatus according to claim 12, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

14. An audio decoding apparatus for decoding an audio stream including a plurality of frames, comprising:

a bit buffer for temporarily storing said audio stream;

a decoder for receiving said audio stream from said bit buffer and decoding said audio stream frame by frame to produce decoded audio data;

a determining circuit, coupled to said bit buffer, for determining an amount of said audio stream stored in said bit buffer; and a control circuit, operatively coupled to said determining circuit and said bit buffer, for controlling said decoder in such a manner that an operational speed becomes faster in accordance with an increase in said amount of said audio stream stored in said bit buffer.

15. The audio decoding apparatus according to claim 14, wherein said control circuit produces a pipeline signal whose pulses indicate a shorter generation period as said amount of said audio stream stored in said bit buffer increases, and supplies said pipeline signal to said decoder.

16. The audio decoding apparatus according to claim 14, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

17. An audio decoding apparatus for decoding an audio stream, comprising:

a bit buffer for temporarily storing said audio stream; and a decoder for receiving said audio stream from said bit buffer and decoding said audio stream to produce decoded audio data, wherein said decoder checks a value of a scale factor in coded audio data included in each frame and operates to skip a part of said audio stream to prevent said audio stream from being decoded when said value of said scale factor is equal to or smaller than a predetermined value.

18. The audio decoding apparatus according to claim 17, wherein said audio stream includes a plurality of frames, and said decoder operates to skip a part of said audio stream frame by frame in order to prevent said audio stream from being decoded.

19. The audio decoding apparatus according to claim 17, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

20. An audio decoding apparatus for decoding an audio stream including a plurality of frames, comprising:

a bit buffer for temporarily storing said audio stream; and a decoder for receiving said audio stream from said bit buffer and decoding said audio stream frame by frame to produce decoded audio data, wherein said decoder includes:

means for determining whether a value of a scale factor in coded audio data in each frame is equal to or smaller than a predetermined value, and a determining circuit, operatively coupled to said bit buffer and said decoder, for determining an amount of said audio stream stored in said bit buffer, and wherein said decoder operates to skip a part of said audio stream frame by frame in order to prevent said audio stream from being decoded when a value of said audio stream is equal to or greater than a given value and said value of said scale factor is equal to or smaller than a predetermined value.

21. The audio decoding apparatus according to claim 20, wherein said audio stream is divided over a plurality of frequency bands, and said decoder includes:

a dequantizer for performing a dequantization of said audio stream to produce a dequantized audio stream;

a band synthesizer, coupled to said dequantizer, for performing a product-sum operation on said dequantized audio stream to combine divided parts of said audio stream over said plurality of frequency bands to thereby produce audio data; and an output circuit, coupled to said band synthesizer, for producing an audio signal from said decoded audio data.

* * * * *